(12) United States Patent
Cheung et al.

(10) Patent No.: US 9,606,171 B2
(45) Date of Patent: Mar. 28, 2017

(54) HIGH THROUGHPUT TEST HANDLER SYSTEM

(71) Applicant: ASM Technology Singapore Pte Ltd, Singapore (SG)

(72) Inventors: Yu Sze Cheung, Kwai Chung (HK); Kai Fung Lau, North Point (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 107 days.

(21) Appl. No.: 14/607,696

(22) Filed: Jan. 28, 2015

(65) Prior Publication Data

US 2016/0216322 A1  Jul. 28, 2016

(51) Int. Cl.
*G01R 31/28* (2006.01)

(52) U.S. Cl.
CPC .................................. *G01R 31/2893* (2013.01)

(58) Field of Classification Search
None
See application file for complete search history.

(56) References Cited

U.S. PATENT DOCUMENTS

| | | | | |
|---|---|---|---|---|
| 2005/0134256 A1* | 6/2005 | Cheng | ............... | G01R 31/2893 324/756.01 |
| 2007/0152655 A1* | 7/2007 | Ham | ............... | G01R 31/2893 324/750.13 |
| 2009/0129899 A1* | 5/2009 | Cheng | ............... | H01L 21/67271 414/225.01 |
| 2010/0097075 A1* | 4/2010 | Sze | ............... | G01R 31/2893 324/555 |
| 2010/0097083 A1* | 4/2010 | Sze | ............... | G01R 31/2893 324/756.01 |
| 2010/0310343 A1* | 12/2010 | Mayer | ............... | G01D 18/00 414/222.07 |
| 2011/0204914 A1* | 8/2011 | Roberts | ............... | G01R 31/2889 324/756.02 |
| 2013/0207679 A1* | 8/2013 | Cheng | ............... | G01R 1/02 324/750.13 |
| 2014/0102850 A1* | 4/2014 | Cheng | ............... | B65G 47/846 198/339.1 |
| 2014/0239998 A1* | 8/2014 | Long | ............... | G01R 31/2601 324/757.01 |
| 2014/0328652 A1* | 11/2014 | Cheng | ............... | H01L 21/67132 414/223.01 |
| 2015/0204943 A1* | 7/2015 | Yip | ............... | G01R 31/2891 324/750.22 |

* cited by examiner

*Primary Examiner* — Jermele M Hollington
*Assistant Examiner* — Suresh K Rajaputra
(74) *Attorney, Agent, or Firm* — Ostrolenk Faber LLP

(57) ABSTRACT

A test handler comprises a main rotary turret and a loading station operative to convey electronic components to functional modules of the main rotary turret. An auxiliary rotary turret incorporating multiple carrier modules then receives electronic components from the functional modules of the main rotary turret. Multiple testing stations located along a periphery of the auxiliary turret are operative to receive electronic components from the carrier modules for testing while the loading station is concurrently conveying electronic components to the functional modules of the main rotary turret, so that the impact of transfer time is reduced or eliminated in a test process cycle of the test handler.

16 Claims, 3 Drawing Sheets

HIGH THROUGHPUT TEST HANDLER SYSTEM

FIELD OF THE INVENTION

The invention relates to a test handler for testing electronic components, and in particular to a test handler for testing electronic components with high throughput.

BACKGROUND AND PRIOR ART

Test handlers for electronic components are used in the industry for testing electronic components that have been assembled. In such test handlers, electronic components are typically fed to a high-speed rotary turret using a vibration bowl feeder or other feeding means. The electronic components are then picked up individually by pick heads on the rotary turret and are subsequently conveyed to various testing stations to conduct one or more tests before they are qualified for use.

A testing cycle for a test handler generally comprises the time taken for transferring the electronic component to the testing station, and the time taken to test it. Especially in a conventional rotary turret used for the approach described above, the transfer time is necessary and cannot be eliminated because the steps of transfer and then testing are performed sequentially in time with respect to each electronic component to be tested. If the testing time is long, the system will have to stay idle for some time until testing is completed and another electronic component may be transferred for testing. This forms a bottleneck which makes it difficult to reduce the overall process cycle time. It would be beneficial to reduce or eliminate the impact of transfer time in the overall test process cycle time.

SUMMARY OF THE INVENTION

It is thus an object of the invention to seek to provide a test handler system which reduces or eliminates the impact of transfer time in a test process cycle so as to boost its overall system throughput.

According to a first aspect of the invention, there is provided a test handler comprising: a main rotary turret; a loading station operative to convey electronic components to functional modules of the main rotary turret; an auxiliary rotary turret incorporating multiple carrier modules for receiving electronic components from the functional modules of the main rotary turret; and multiple testing stations located along a periphery of the auxiliary turret; wherein the testing stations are operative to receive electronic components from the carrier modules for testing while the loading station is concurrently conveying electronic components to the functional modules of the main rotary turret.

According to a second aspect of the invention, there is provided a method for testing electronic components using a test handler, comprising the steps of: conveying electronic components from a loading station to functional modules of a main rotary turret; transferring electronic components from the functional modules of the main rotary turret to multiple carrier modules of an auxiliary rotary turret; and conveying the electronic components to multiple testing stations located along a periphery of the auxiliary turret; and thereafter testing the electronic components received from the carrier modules at the multiple testing stations while concurrently continuing to convey electronic components from the loading station to the functional modules of the main rotary turret.

It would be convenient hereinafter to describe the invention in greater detail by reference to the accompanying drawings which illustrate specific preferred embodiments of the invention. The particularity of the drawings and the related description is not to be understood as superseding the generality of the broad identification of the invention as defined by the claims.

BRIEF DESCRIPTION OF THE DRAWINGS

Examples of test handler systems in accordance with the invention will now be described with reference to the accompanying drawings, in which.

DETAILED DESCRIPTION OF THE PREFERRED EMBODIMENT OF THE INVENTION

Figure 1:
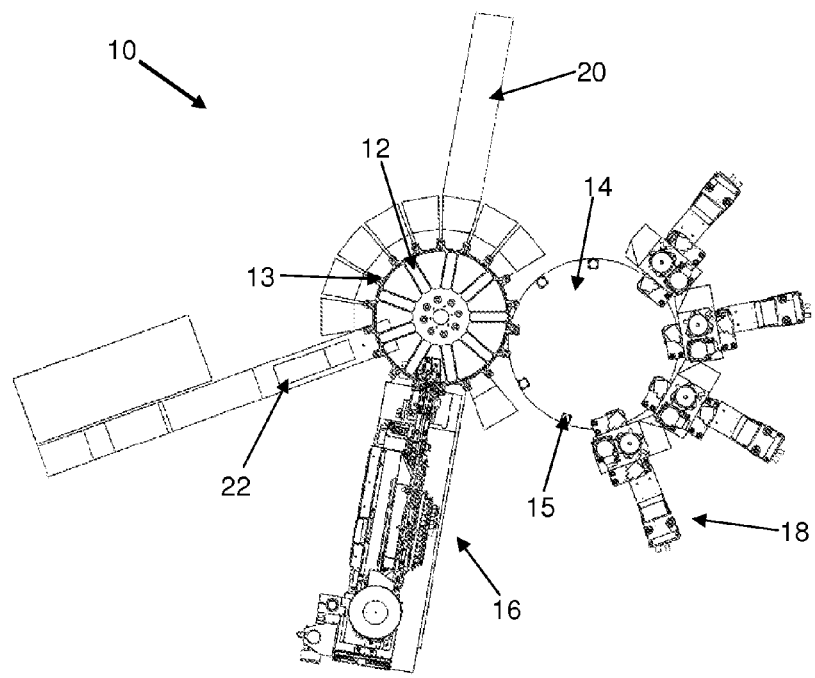
FIG. 1 is a plan view of a test handler system according to a first preferred embodiment of the invention.
Figure 2:
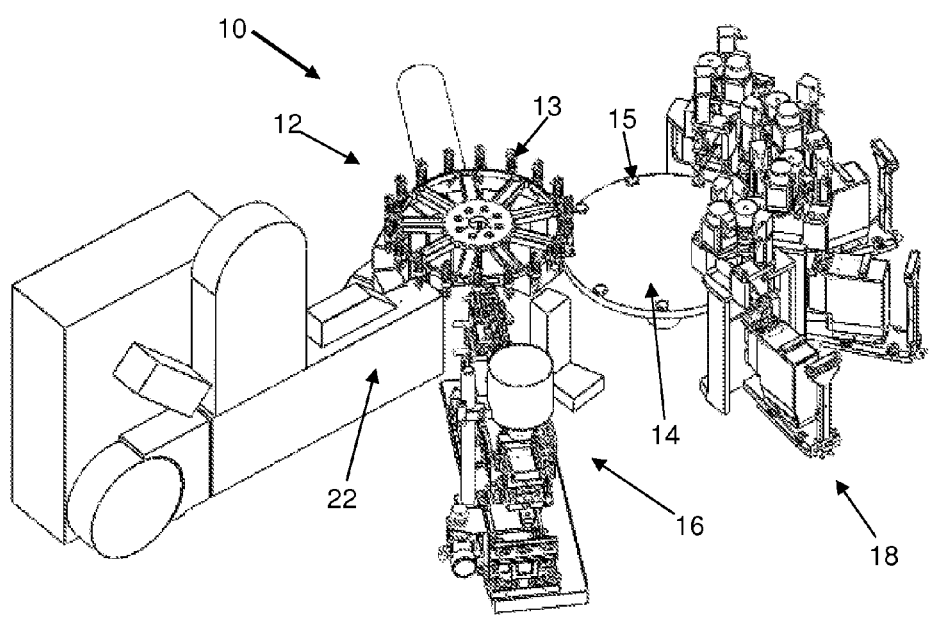
FIG. 2 is an isometric view of the test handler system of FIG. 1.

FIG. 1 is a plan view of a test handler system 10 according to a first preferred embodiment of the invention, whereas FIG. 2 is an isometric view of the test handler system of FIG. 1. The test handler system 10 generally comprises a main rotary turret 12 having a plurality of functional modules 13 for receiving and processing electronic components, and an auxiliary rotary turret 14 having a plurality of carrier modules 15 for receiving electronic components for testing. A loading station 16 is designed to convey in bulk electronic components towards the functional modules 13 of the main rotary turret 12.

Electronic components that are loaded onto the functional modules 13 of the main rotary turret 12 are carried by pick heads on the functional modules 13 and moved to the location of the auxiliary rotary turret 14 by rotation of the main rotary turret 12, and are then transferred onto carrier modules 15 of the auxiliary rotary turret 14. Electronic components transferred onto the auxiliary rotary turret 14 are further moved by rotation of the auxiliary rotary turret 14 to multiple testing stations 18 where pick heads are positioned for picking up electronic components from the auxiliary rotary turret 14 for testing (as described below). The testing stations 18 are operative to receive electronic components from the carrier modules 15 for testing, while the loading station 16 is concurrently continuing to convey electronic components to the functional modules of the main rotary turret 12. This ensures that the main rotary turret 12 need not remain idle while electronic components are being tested.

Multiple testing stations 18 should be configured to conduct a same type of test on the electronic components so as to dramatically increase throughput. Tested electronic components are thereafter placed back onto the auxiliary rotary turret 14, conveyed by rotation to the position of the main rotary turret 12 and they are then transferred to the functional modules 13 of the main rotary turret 12.

Finally, electronic components returned to the main rotary turret 12 which were found to be defective are dropped into a disposal bin 20, whereas electronic components that have passed the tests at the testing stations 18 are offloaded via an offloading station 22. Hence, defective electronic components are separated from non-defective ones.

Figure 3:
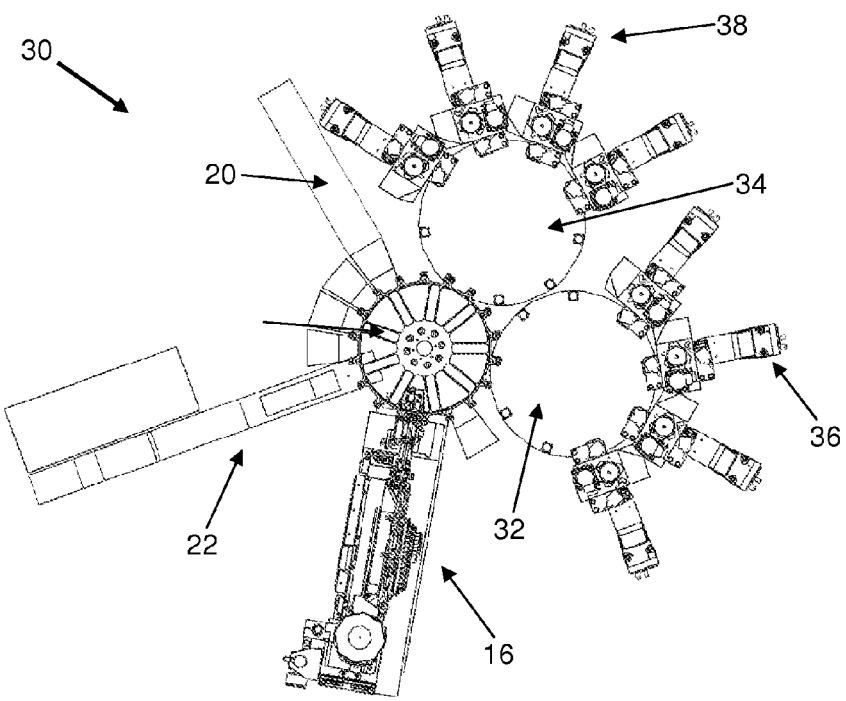
FIG. 3 is a plan view of a test handler system according to a second preferred embodiment of the invention.

FIG. 3 is a plan view of a test handler system 30 according to a second preferred embodiment of the invention. In the second embodiment, there are first and second auxiliary rotary turrets 32, 34 positioned next to the main rotary turret 12. The first auxiliary rotary turret 32 has a first set of multiple testing stations 36 located around its periphery, whereas the second auxiliary rotary turret has a further or second set of multiple testing stations 38 located around its periphery. The first set of multiple testing stations 36 may conduct the same tests as the second set of multiple testing stations 38, for instance, if the testing process is a relatively time-consuming one, and more testing stations 36, 38 are required to improve throughput of the test handler system 30. In this case, electronic components may be transferred either to the first auxiliary rotary turret 32 or to the second auxiliary rotary turret 34 for testing.

On the other hand, it should also be understood that the first set of multiple testing stations 36 may conduct different tests from the second set of multiple testing stations 38. Thus, there is flexibility to design the testing stations 36, 38 according to a user's needs. In this case, after the electronic components have been transferred to the first auxiliary rotary turret 32 to undergo tests, the electronic components would be transferred to the second auxiliary rotary turret 32 (either directly or via the main rotary turret 12) to undergo different tests.

Figure 4:
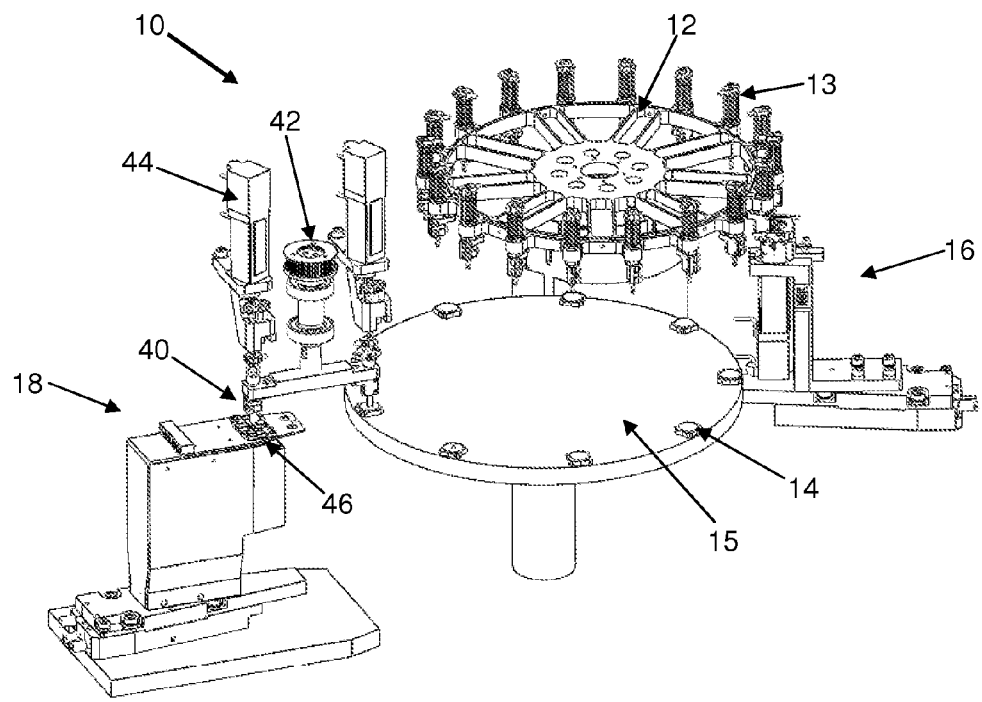
FIG. 4 is an isometric view of the test handler system illustrating a testing station that is located adjacent to an auxiliary rotary turret.
Figure 5A:
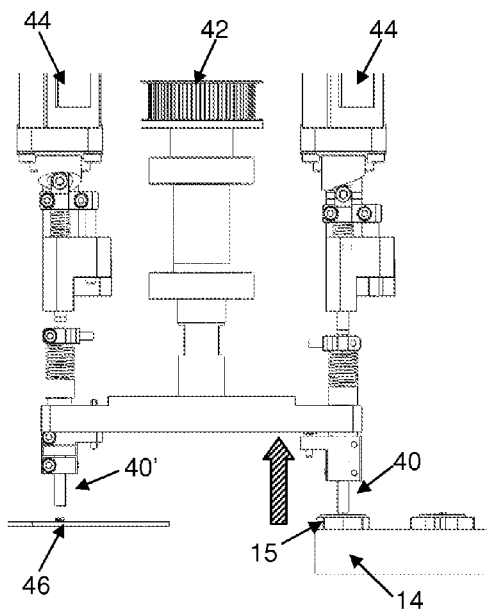
FIGS. 5(a) to 5(d) illustrate pick heads of the testing station transferring electronic components between the auxiliary rotary turret and a test platform according to the preferred embodiment of the invention.
Figure 5B:
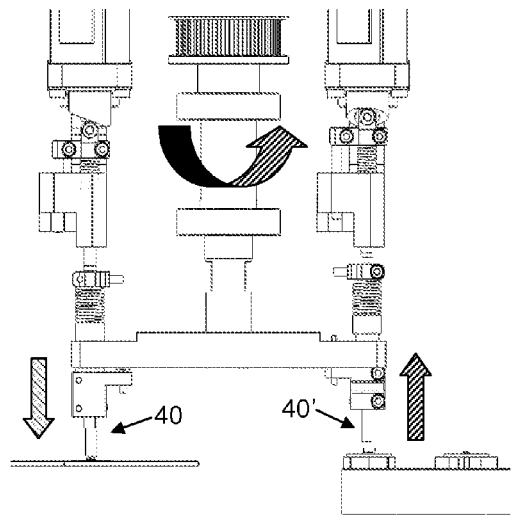
Figure 5C:
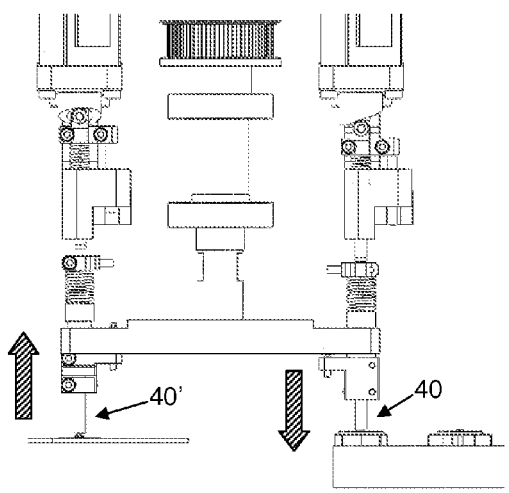
Figure 5D:
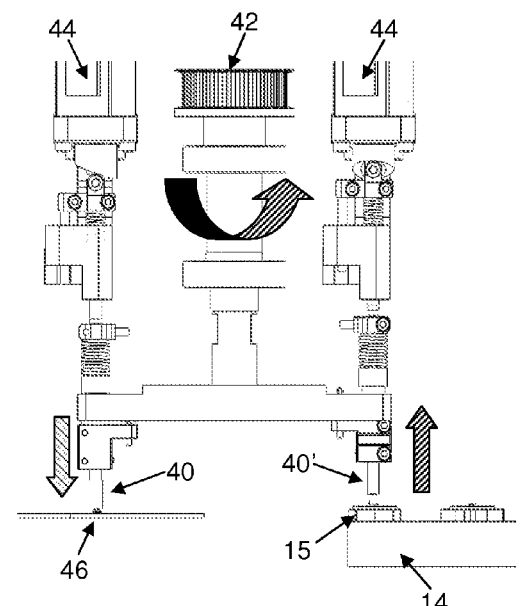

FIG. 4 is an isometric view of the test handler system 10 illustrating one testing station 18 that is located adjacent to an auxiliary rotary turret 14. For the sake of simplicity, only one of the multiple testing stations 18 mentioned in respect of FIGS. 1 and 2 is illustrated. The testing station 18 includes a pair of reciprocating pick heads 40 arranged about a rotary driver 42. The pick heads 40 are separated by an angle of 180 degrees from each other, to enable the rotary driver 42 to rotate the pick heads 40 to alternatively position them either over the carrier modules 15 of the auxiliary rotary turret 14, or over a test platform 46 of the testing station 18. Furthermore, a vertical driver 44 coupled to each pick head 40 lowers the pick head 40 to pick up an electronic component at a first position, raises the pick head 40 before it is rotated to transfer the electronic component to a second position, and lowers the pick head 40 to place the electronic component at the second position. By transferring electronic components to a test platform 46 separated from the auxiliary rotary turret 14 for testing, the auxiliary rotary turret 14 may continue to receive additional electronic components during testing of other electronic components.

FIGS. 5(*a*) to 5(*d*) illustrate pick heads 40, 40' of the testing station 18 transferring electronic components between the auxiliary rotary turret 14 and the test platform 46 according to the preferred embodiment of the invention.

In FIG. 5(*a*), a first pick head 40 picks up an electronic component from the carrier module 15 of the auxiliary rotary turret 14. In FIG. 5(*b*), the pick heads 40, 40' have been rotated by an angle of 180 degrees relative to each other. The first pick head 40' now places the electronic component onto the test platform 46 for testing, while the second pick head 40 picks up another electronic component from the carrier module 15 of the auxiliary rotary turret 14.

In FIG. 5(*c*), after the electronic component has been tested and the tested electronic component is picked up again by the first pick head 40, the pick heads 40, 40' are again rotated by an angle of 180 degrees relative to each other. The tested electronic component is then placed back to an empty carrier module 15 of the auxiliary rotary turret 14 by the first pick head 40 while the second pick head 40' places another electronic component onto the test platform 46 for testing.

In FIG. 5(*d*), the auxiliary rotary turret 14 has indexed forward to convey the next untested electronic component underneath the emptied first pick head 40 and the untested electronic component has been picked up by the first pick head 40. The pick heads 40, 40' have been rotated by 180 degrees relative to each other, and the first pick head 40 is now placing the untested electronic component onto the test platform 46 for testing. The transfer process as described above will be repeated for subsequent test cycles.

While the electronic components are being tested, the main rotary turret 12 may continue to load electronic components onto the auxiliary rotary turret 14 with minimal interruption since the loading of electronic components onto the auxiliary rotary turret 14 does not need to wait for the testing of other electronic components to be completed. Correspondingly, the main rotary turret 12 may continue to receive untested electronic components from the loading station 16.

It should be appreciated that the test handler systems 10, 30 according to the preferred embodiments of the invention help to reduce or eliminate the transfer time in a test cycle so as to boost the throughput of the testing handling systems 10, 30. The introduction of one or more auxiliary rotary turrets 14, 32, 34 allows an electronic component transfer motion to be performed during the test cycle, thereby avoiding the time taken for transferring the electronic components adding to the test cycle time because the required test on an electronic component can be carried out simultaneously in time with the transfer of other electronic components which are being conveyed.

With the aforesaid arrangement, it has been found that for some types of electronic components with pre-defined test time ranges, the system throughput can be boosted by more than 50% as compared to the throughput of prior art test handler systems for the same types of electronic components.

The invention described herein is susceptible to variations, modifications and/or additions other than those specifically described and it is to be understood that the invention includes all such variations, modifications and/or additions which fall within the spirit and scope of the above description.

The invention claimed is:

1. A test handler comprising:
   a main rotary turret;
   a loading station operative to convey electronic components to functional modules of the main rotary turret;
   an auxiliary rotary turret incorporating multiple carrier modules for receiving electronic components from the functional modules of the main rotary turret; and
   multiple testing stations located along a periphery of the auxiliary turret, each testing station further comprising pick heads for transferring electronic components between the carrier modules of the auxiliary rotary turret and a test platform of the testing station for testing;
   wherein the testing stations are operative to receive electronic components from the carrier modules of the auxiliary rotary turret for testing while the loading station is concurrently conveying electronic components to the functional modules of the main rotary turret.

2. The test handler as claimed in claim 1, wherein each of the testing stations is configured to conduct a same type of test on the electronic components as another testing station.

3. The test handler as claimed in claim 1, wherein the pick heads comprise a pair of reciprocating pick heads arranged about a rotary driver.

4. The test handler as claimed in claim 3, wherein the pick heads are separated by an angle of 180 degrees from each other, and are alternatively positioned either over the carrier modules or over the test platform.

5. The test handler as claimed in claim 3, further comprising a vertical driver coupled to each pick head which is configured to lower the pick head to pick up an electronic component at a first position, and to raise the pick head before the pick head is rotated for transferring the electronic components to a second position.

6. The test handler as claimed in claim 1, further comprising:
   a further auxiliary rotary turret having a further set of multiple carrier modules; and
   a further set of multiple testing stations located along a periphery of the further auxiliary turret for testing the electronic components.

7. The test handler as claimed in claim 6, wherein the further set of multiple carrier modules is configured to receive electronic components from the main rotary turret.

8. The test handler as claimed in claim 7, wherein the further set of multiple testing stations conducts a same type of test on the electronic components as the multiple testing stations of the auxiliary turret.

9. The test handler as claimed in claim 6, wherein the further set of multiple carrier modules is configured to receive electronic components from the auxiliary rotary turret.

10. A method for testing electronic components using a test handler, comprising the steps of:
    conveying electronic components from a loading station to functional modules of a main rotary turret;
    transferring electronic components from the functional modules of the main rotary turret to multiple carrier modules of an auxiliary rotary turret; and
    conveying the electronic components to multiple testing stations located along a periphery of the auxiliary turret;
    using pick heads comprised in the multiple testing stations to transfer electronic components from the carrier modules of the auxiliary rotary turret to respective test platforms of the testing stations; and thereafter
    testing the electronic components received from the carrier modules at the testing platforms of the multiple testing stations while concurrently continuing to convey electronic components from the loading station to the functional modules of the main rotary turret.

11. The method for testing electronic components as claimed in claim 10, wherein each of the testing stations conducts a same type of test on the electronic components as another testing station.

12. The method for testing electronic components as claimed in claim 10, further comprising the step of testing the electronic components while the auxiliary rotary turret continues to receive additional electronic components during testing of other electronic components.

13. The method for testing electronic components as claimed in claim 10, further comprising the steps of:
    transferring electronic components to a further auxiliary rotary turret including a further set of multiple carrier modules and a further set of multiple testing stations located along a periphery of the further auxiliary turret; and
    testing the electronic components at the further set of multiple testing stations.

14. The method for testing electronic components as claimed in claim 13, wherein the further set of multiple carrier modules receives electronic components from the main rotary turret.

15. The method for testing electronic components as claimed in claim 14, wherein the further set of multiple testing stations conducts a same type of test on the electronic components as the multiple testing stations of the auxiliary turret.

16. The method for testing electronic components as claimed in claim 13, wherein the further set of multiple carrier modules receives electronic components from the multiple carrier modules of the auxiliary rotary turret.

* * * * *